United States Patent
Eliav et al.

(10) Patent No.: US 7,390,671 B2
(45) Date of Patent: Jun. 24, 2008

(54) METHOD OF SELECTIVE EXCITATION FOR IMPROVING CONTRAST IN MAGNETIC RESONANCE IMAGING

(75) Inventors: Uzi Eliav, Tel Aviv (IL); Gil Navon, Ramat Gan (IL); Arnon Neufeld, Tel Aviv (IL)

(73) Assignee: Ramot At Tel Aviv University Ltd., Tel Aviv (IL)

( * ) Notice: Subject to any disclaimer, the term of this patent is extended or adjusted under 35 U.S.C. 154(b) by 971 days.

(21) Appl. No.: 10/450,838

(22) PCT Filed: Nov. 19, 2001

(86) PCT No.: PCT/IL01/01064

§ 371 (c)(1), (2), (4) Date: Jun. 26, 2003

(87) PCT Pub. No.: WO02/052283

PCT Pub. Date: Jul. 4, 2002

(65) Prior Publication Data

US 2004/0064034 A1    Apr. 1, 2004

Related U.S. Application Data

(60) Provisional application No. 60/258,043, filed on Dec. 27, 2000.

(51) Int. Cl.
*G01N 24/00* (2006.01)
*A61B 5/05* (2006.01)

(52) U.S. Cl. .................... 436/173; 600/407

(58) Field of Classification Search .................. None
See application file for complete search history.

(56) References Cited

OTHER PUBLICATIONS

Henkelman et al. "Magnetization transfer in MRI: a review", NMR in Biomedicine, 2001, v. 14, pp. 57-64.*
Navon et al. "Multiquantum filters and ordr in tissues", NMR in Biomedicine, 2001, v. 14, pp. 112-132.*
Lei et al, "The Effects of Slice-Selective Excitation/Refocusing in Localized Spectral Editing with Gradient-Selected Double-Quantum Coherence Transfer", *J. Magnetic Resonance*, 150:17-25, 2001.
Eliav et al, "A Study of Dipolar Interactions and Dynamic Processes of Water Molecules in Tendon by $^1$H and $^2$H Homonuclear and Heteronuclear Multiple-Quantum-Filtered NMR Spectroscopy", *J. Magnetic Resonance*, 137:295-310, 1999.
Mareci et al, "Tip-Angle-Reduced T1 Imaging", *J. Magnetic Resonance*, 67(1):55-65, 1986 (Abstract).
Merboldt et al, "Self-Diffusion NMR Imaging Using Stimulated Echoes", *J. Magnetic Resonance*, 64(3):479-486, 1985 (Abstract).

(Continued)

*Primary Examiner*—Yelena G Gakh (57) ABSTRACT

A method of magnetic resonance analysis of at least one type of molecules present in a solvent, the method comprises (a) applying a first radiofrequency pulse sequence selected so as to initially select a coherence of an order n for the at least one type of molecules in the solvent, wherein n is zero, a positive or a negative integer other than ±1, and thereafter to select an exclusive excitation of the at least one type of molecules in the solvent; (b) measuring at least one magnetic resonance parameter of the solvent; and (c) using the at least one magnetic resonance parameter of the solvent for calculating at least one magnetic resonance parameter of the at least one molecule.

81 Claims, 6 Drawing Sheets

OTHER PUBLICATIONS

Salustri, C., "Lack of Magetization Transfer From the Ferritin Molecule", *J. Magnetic Resonance*, Ser.B 111(2):171-173, 1996 (Abstract).

Scholz et al, "Water-Macromolecular Proton Magnetization Transfer In Infarcted Myocardium: A Method To Enhance Magnetic Resonance Image Contrast", *Magn Reson Med.* Feb. 1995;33(2):178-84.

Gray et al, "Magnetization Transfer In Cartilage And Its Constituent Macromolecules", *Magn Reson Med.* Sep. 1995;34(3):319-25.

Henkelman et al, "Quantitative Interpretation Of Magnetization Transfer", *Magn Reson Med.* Jun. 1993;29(6):759-66.

Scheck et al, "The Carpal Ligaments In MR Arthrography Of The Wrist: Correlation With Standard MRI And Wrist Arthroscopy", *J Magn Reson Imaging.* Mar. 1999;9(3):468-74.

Peterfy et al, "MR Imaging Of The Arthritic Knee: Improved Discrimination Of Cartilage, Synovium, And Effusion With Pulsed Saturation Transfer And Fat-Suppressed T1-Weighted Sequences", *Radiology.* May 1994;191(2):413-9.

Xia et al, "Diffusion And Relaxation Mapping Of Cartilage-Bone Plugs And Excised Disks Using Microscopic Magnetic Resonance Imaging", *Magn Reson Med.* Mar. 1994;31(3):273-82.

Gold et al, "MR Spectroscopic Imaging Of Collagen: Tendons And Knee Menisci", *Magn Reson Med.* Nov. 1995;34(5):647-54.

Tsoref et al, "Proton Double-Quantum Filtered MRI—A New Method For Imaging Ordered Tissues", *Magn Reson Med.* Nov. 1998;40(5):720-6.

Bodenausen et al, "Selection of Coherence-Transfer Pathways in NMR Pulse Experiments", *J Magn Reson*, 58:371-387, 1984.

Bowden et al, "Tensor Operator Formalism for Multiple-Quantum NMR. 2. Spins 3/2, 2, and 5/2 and General I", *J Magn Reson*, 58:370-388, 1984.

Bowden et al, "Tensor Operator Formalism for Multiple-Quantum NMR. 1. Spin-1 Nuclei", *J Magn Reson*, 67:403-414, 1986.

Callaghan, PT, "Principles of Nuclear Magnetic Resonance Microscopy", Clarendon Press-Oxford 1993, pp. 133, 134, 286.

* cited by examiner

Fig. 6b ced tissue to the next. These quantities are therefore responsible for contrast between tissues in various imaging techniques, hence permitting image segmentation.

METHOD OF SELECTIVE EXCITATION FOR IMPROVING CONTRAST IN MAGNETIC RESONANCE IMAGING

RELATED PATENT APPLICATION

This application is a National Phase Application of PCT/IL01/01064 International Filing Date 19 Nov. 2001, which claims priority from U.S. Provisional patent application No. 60/258,043 filed 27 Dec. 2000.

FIELD AND BACKGROUND OF THE INVENTION

The present invention relates to Magnetic Resonance Imaging (MRI) and, more particularly, to a method of selective excitation so as to improve contrast in Magnetic Resonance Imaging of, for example, connective and other tissues.

Magnetic Resonance Imaging (MRI) is a method to obtain an image representing the chemical and physical microscopic properties of materials, by utilizing a quantum mechanical phenomenon, named Nuclear Magnetic Resonance (NMR), in which a system of spins, placed in a magnetic field resonantly absorb energy, when applied with a certain frequency.

A nucleus can experience NMR only if its nuclear spin I does not vanish, i.e., the nucleus has at least one unpaired nucleon. Examples of non-zero spin nuclei frequently used in MRI include $^1H$ (I=½), $^2H$ (I=1), $^{23}Na$ (I=3/2), etc. When placed in a magnetic field, a nucleus having a spin I is allowed to be in a discrete set of energy levels, the number of which is determined by I, and the separation of which is determined by the gyromagnetic ratio of the nucleus and by the magnetic field. Under the influence of a small perturbation, manifested as a radiofrequency magnetic field, which rotates about the direction of a primary static magnetic field, the nucleus has a time dependent probability to experience a transition from one energy level to another. With a specific frequency of the rotating magnetic field, the transition probability may reach the value of unity. Hence at certain times, a transition is forced on the nucleus, even though the rotating magnetic field may be of small magnitude relative to the primary magnetic field. For an ensemble of spin I nuclei the transitions are realized through a change in the overall magnetization.

Once a change in the magnetization occurs, a system of spins tends to restore its magnetization longitudinal equilibrium value, by the thermodynamic principle of minimal energy. The time constant which control the elapsed time for the system to return to the equilibrium value is called "spin-lattice relaxation time" or "longitudinal relaxation time" and is denoted $T_1$. An additional time constant, $T_2$ ($\leq T_1$), called "spin-spin relaxation time" or "transverse relaxation time", controls the elapsed time in which the transverse magnetization diminishes, by the principle of maximal entropy. However, inter-molecule interactions and local variations in the value of the static magnetic field, alter the value of $T_2$, to an actual value denoted $T_2^*$.

In MRI, a static magnetic field having a predetermined gradient is applied on an object, thereby creating, at each region of the object, a unique magnetic field. By detecting the NMR signal, knowing the magnetic field gradient, the position of each region of the object can be imaged.

In MRI, pulse sequences are applied to the object (e.g., a patient) to generate NMR signals and obtain information therefrom which is subsequently used to reconstruct images of the object. The above mentioned relaxation times and the density distribution of the nuclear spin are properties which vary from one normal tissue to the next, and from one diseased tissue to the next. These quantities are therefore responsible for contrast between tissues in various imaging techniques, hence permitting image segmentation.

A common characteristic for all of these techniques is that the properties of water molecules are measured, which properties are indirectly dependent on interaction with macromolecules such as proteins.

Connective tissues, such as ligaments, tendons and cartilage appear in standard magnetic resonance (MR) images with low signal-to-noise (S/N) ratio (SNR) due to the water long $T_2$ relaxation times. Images performed with short echo time (TE), result in a significant loss of contrast. In addition to the need to enhance the NMR signal of connective tissues, it is also important to increase the contrast between the different compartments within a specific tissue and between adjacent tissues.

A more modern method is the Magnetization Transfer Contrast (MTC) method [T. D. Scholz, R. F. Hyot, J. R. DeLeonardis, T. L. Ceckler, R. S. Balaban, Water-macromolecular proton magnetization transfer in infracted myocardium: a method to enhance magnetic resonance image contrast, Magn. Reson. Med 1995; 33:178-184; M. L. Gray, D. Burstein, L. M. Lesperance, L. Gehrke, Magnetization transfer in cartilage and its constituent macromolecules, Magn. Reson. Med. 1995; 34: 319-325; R. M. Henkelman, X. Huang, Q.-S. Xiang, G. J. Staniz, S. D. Swanson, M. J. Bronskill, Quantitative interpretation of magnetization transfer, Magn. Reson. Med. 1993; 29:759-766]. According to the MTC method, the contrast between tissues is increased by physical means rather than chemical means. For this technique to be effective, there must be at least two spin systems in the imaged anatomy which are capable of exchanging energy between themselves and one of the systems must have a transverse relaxation time which is shorter than that of the other system. A typical example for such two spin systems is protein, with a short $T_2$, and water with a long $T_2$.

Due to the inverse relationship between $T_2$ and the NMR spectral linewidth, a broad peak would be observed from the protein and a narrow peak would be observed from the water, had the two systems been imaged separately. However, when these systems are analyzed simultaneously, the signal from the protein spread out over the entire image and will not be visible. According to the MTC method, an appropriate pulse sequence is applied so as to saturate the protein spin system and not the water. Consequently, water molecules being in contact with the protein are capable of exchanging magnetization with the protein. Hence, saturating the protein ensures contrast between water being in contact with the protein and water being far from the protein.

Although MTC is a method which is more directly dependent on the nature of the proteins, it has two major drawbacks. First, in MTC signals indicating magnetization transfer from the protein to the water are entangled with signals indicating direct excitation of the water molecules. Secondly, the long time scale in MTC prevents independent measurement of the protein relaxation time $T_2$, and of intramolecular processes within the proteins, such as spin diffusion.

Other methods developed to meet the above requirements of contrast increment, include heavily $T_1$ weighted imaging [R. J. Scheck, A. Romagnolo, R. Hiemer, T. Pfluger, K. Wilhelm, K. Hahn, The carpal ligaments in MR arthrography of the wrist: correlation with standard MRI and wrist arthroscopy, J. Magn. Reson. Imag. 1999; 9:468-474], fat suppression [C. G. Peterfy, S. Majumdar, P. Lang, C. F. van Dijke, K. Sack, H. K. Ganant, MR Imaging of the arthritic knee: improved discrimination of cartilage, synovium, and effusion with pulsed saturation transfer and fat-suppressed $T_1$-weighted sequences, Radiology 1994; 191:413-419], diffusion weighted imaging [Y. Xia, T. Farquhar, N. Burton-Wurster, E. Ray, L. Jelinski, Diffusion and relaxation mapping of cartilage-bone plugs and excised disk using micromagnetic resonance imaging, Magn. Reson. Med. 1994; 31:273-282] and projection reconstruction techniques that achieve much shorter echo time than conventional methods [G. E. Gold, J. M. Pauly, A. Macovsky, R. J. Herfkens, MR spectroscopic imaging of collagen: tendons and knee menisci, Magn. Reson. Med. 1995; 34:647-654].

Another way to obtain contrast, with specific enhancement for ordered tissues, such as articular cartilage and tendons, is Double Quantum Filter [Tsoref, H. Shinar, Y. Seo, U. Eliav, G. Navon, Proton Double Quantum Filtered MRI—A New Method for Imaging Ordered Tissues, Magn. Reson. Med. 1998; 40:720-726; U. Eliav and G. Navon, A Study of Dipolar Interactions and Dynamic Processes of Water Molecules in Tendon by $^1$H and $^2$H Homonuclear and Hetronuclear Multiple-Quantum-Filtered NMR Spectroscopy, J. Magn. Reson. 1999; 137:295-310. This method is based on the residual intramolecular dipolar interaction in water molecules whose motion is restricted by the anisotropy induced by ordered proteins such as collagen fibers. The contrast in DQF MRI stems from the fact that only water molecules associated with ordered structures are detected, and signals originating from molecules in isotropic tissues are suppressed.

While these approaches do increase the MR signal of connective tissues and the contrast between connective and adjacent tissues, the results are not yet optimal for diagnostic purposes.

There is thus a widely recognized need for, and it would be highly advantageous to have, a method of magnetic resonance imaging devoid of the above limitations, including the observed signal reflecting to the first order water solvent properties, rather than those of proteins.

SUMMARY OF THE INVENTION

According to one aspect of the present invention there is provided a method of magnetic resonance analysis of at least one type of molecules present in a solvent, the method comprising: (a) applying a first radiofrequency pulse sequence selected so as to initially select a coherence of an order n for the at least one type of molecules in the solvent, wherein n is zero, a positive or a negative integer other than ±1, and thereafter to select an exclusive excitation of the at least one type of molecules in the solvent; (b) measuring at least one magnetic resonance parameter of the solvent; and (c) using the at least one magnetic resonance parameter of the solvent for calculating at least one magnetic resonance parameter of the at least one molecule.

According to further features in preferred embodiments of the invention described below, the at least one type of molecules present in the solvent is selected from the group consisting of molecule dissolved in the solvent, a molecule dispersed in the solvent and a molecule emulsed in the solvent.

According to still further features in the described preferred embodiments the at least one type of molecules is at least one macromolecule.

According to still further features in the described preferred embodiments the at least one type of molecules and the solvent each characterized by an NMR spectrum characterized by a plurality of NMR spectral lines, the NMR spectral lines characterizing the at least one type of molecules are wider than the NMR spectral lines characterizing the solvent.

According to still further features in the described preferred embodiments the at least one magnetic resonance parameter of the at least one type of molecules includes a longitudinal magnetization of the at least one type of molecules, with respect to a direction of the primary magnetic field.

According to still further features in the described preferred embodiments measuring the at least one magnetic resonance parameter of the solvent, comprises (i) applying a second radiofrequency pulse sequence selected so as to: restore a zero-order coherence and a first order rank to the at least one type of molecules; achieve transfer of the zero-order coherence and a first order rank to the solvent by intrinsic physical and chemical processes; and provide at least one detectable component of the magnetic resonance parameter of the solvent; and (ii) acquiring a radiofrequency signal resulting from the solvent.

According to another aspect of the present invention there is provided a method of magnetic resonance imaging of an object having solvent components and non-solvent components, the method comprising: (a) applying a first radiofrequency pulse sequence selected so as to initially select a coherence of an order n to the solvent components and the non-solvent components, wherein n is zero, a positive or a negative integer other than ±1 and thereafter to select an exclusive excitation of the non-solvent components; and (b) measuring at least one magnetic resonance parameter of the solvent components; and (c) using the at least one magnetic resonance parameter of the solvent components for calculating at least one magnetic resonance parameter of the non-solvent components so as to construct a magnetic resonance image of the object.

According to further features in preferred embodiments of the invention described below, the object is a tissue.

According to still further features in the described preferred embodiments the tissue is a connective tissue.

According to still further features in the described preferred embodiments the tissue is selected from the group consisting of a tendon, a portion of a skin, a bone, a muscle, a cartilage, a blood vessel, a ligament, an organ or a portion thereof, a nerve and a lymph node.

According to still further features in the described preferred embodiments the organ is selected from the group consisting of a brain, a heart, a kidney, a gland, a testicle, an ovary, an eye, a liver, a pancreas and a spleen.

According to still further features in the described preferred embodiments the non-solvent components are macromolecules.

According to still further features in the described preferred embodiments the macromolecule is selected from the group consisting of a protein, a glycoprotein, a proteolipid, a lipid, a carbohydrate, a nucleic acid and a complex of macromolecules which comprises at least two components selected from the group consisting of a protein, a glycoprotein, a proteolipid, a lipid, a carbohydrate, a nucleic acid.

According to still further features in the described preferred embodiments the solvent components are polar solvent components.

According to still further features in the described preferred embodiments the solvent components are apolar solvent components.

According to still further features in the described preferred embodiments the solvent components are water components.

According to still further features in the described preferred embodiments the solvent components include buffering agents.

According to still further features in the described preferred embodiments the non-solvent components and the solvent components each characterized by an NMR spectrum characterized by a plurality of NMR spectral lines, the NMR spectral lines characterizing the non-solvent components are wider than the NMR spectral lines characterizing the solvent components.

According to still further features in the described preferred embodiments the at least one magnetic resonance parameter of the solvent components includes a transverse magnetization of the solvent components, with respect to a direction of a primary magnetic field.

According to still further features in the described preferred embodiments the at least one magnetic resonance parameter of the non-solvent components includes a longitudinal magnetization of the non-solvent components, with respect to a direction of the primary magnetic field.

According to still further features in the described preferred embodiments the coherence is selected from the group consisting of double quantum filter (DQF), where n is selected from the group consisting of +2 and −2 and triple quantum filter (TQF), where n is selected from the group consisting of +3 and −3.

According to still further features in the described preferred embodiments the coherence is selected by phase cycling or gradient selection.

According to still further features in the described preferred embodiments the first radiofrequency pulse sequence is selected so as to enable imaging of an atomic nucleus selected from the group consisting of $^1H$, $^2H$ and $^{23}Na$.

According to still further features in the described preferred embodiments the first radiofrequency pulse sequence is selected so as to optimize imaging of the atomic nucleus.

According to still further features in the described preferred embodiments the first radiofrequency pulse sequence includes a first 90° radiofrequency pulse, a first half creation time interval, a second 90° radiofrequency pulse, a multiple quantum evolution time interval, a third 90° radiofrequency pulse and a second half creation time interval.

According to still further features in the described preferred embodiments a slice-refocusing gradient is employed during a time interval selected from the group consisting of the first half creation time interval, the second half creation time interval the multiple quantum evolution time interval and a time to echo.

According to still further features in the described preferred embodiments a refocusing read gradient is employed during a time interval selected from the group consisting of the first half creation time interval, the second half creation time interval the multiple quantum evolution time interval and a time to echo.

According to still further features in the described preferred embodiments a phase gradient is employed during a time interval selected from the group consisting of the first half creation time interval, the second half creation time interval the multiple quantum evolution time interval and a time to echo.

According to still further features in the described preferred embodiments the multiple quantum evolution time interval is a double quantum evolution time interval.

According to still further features in the described preferred embodiments the multiple quantum evolution time interval is a triple quantum evolution time interval.

According to still further features in the described preferred embodiments the multiple quantum evolution time interval is selected so as to optimize a resolution between the non-solvent components which are characterized by different multiple quantum relaxation times.

According to still further features in the described preferred embodiments the method further comprising applying a crusher pulse prior to step (a).

According to still further features in the described preferred embodiments the crusher pulse is selected from the group consisting of a magnetic gradient pulse, a radiofrequency pulse and a combination thereof.

According to still further features in the described preferred embodiments the crusher pulse includes a first 90° radiofrequency pulse, followed by a gradient pulse.

According to still further features in the described preferred embodiments measuring the at least one magnetic resonance parameter of the solvent components, comprises (i) applying a second radiofrequency pulse sequence selected so as to: restore a zero-order coherence and a first order rank to the non-solvent components; achieve transfer of the zero-order coherence and a first order rank to the solvent components by intrinsic physical and chemical processes; and select a slice of the object to be imaged and create an image; and acquiring a radiofrequency signal resulting from the solvent components.

According to still further features in the described preferred embodiments the first half creation time and the second half creation time are selected so as to maximize the radiofrequency signal or to obtain a desired contrast.

According to still further features in the described preferred embodiments the first half creation time and the second half creation time are selected so as to create images that are weighted by the size of the dipolar interaction in the non-solvent components.

According to still further features in the described preferred embodiments the second radiofrequency pulse sequence includes a forth radiofrequency pulse, a magnetization transfer period, and a pulse subsequence that creates Free Induction Decay (FID) for spectroscopic and imaging purposes.

According to still further features in the described preferred embodiments the magnetization transfer period is selected so as to create images that are weighted by a rate of spin diffusion within the non-solvent components.

According to still further features in the described preferred embodiments the magnetization transfer period is selected so as to create images that are weighted by a rate of spin diffusion within the at least one type of molecules.

According to still further features in the described preferred embodiments the magnetization transfer period is selected so as to create images that are weighted by a rate of magnetization transfer from the non-solvent components to the solvent components.

According to still further features in the described preferred embodiments the magnetization transfer period is selected so as to create images that are weighted by a rate of magnetization transfer from the at least one type of molecules to the solvent.

According to still further features in the described preferred embodiments the magnetization transfer period is selected so as to create images that are weighted by at least one spin-lattice relaxation time of the solvent components.

According to still further features in the described preferred embodiments wherein the forth radiofrequency pulse is a forth 90° radiofrequency pulse.

According to still further features in the described preferred embodiments the pulse subsequence includes a hard radiofrequency pulse.

According to still further features in the described preferred embodiments the pulse subsequence includes a localized spectroscopy pulse subsequence.

According to still further features in the described preferred embodiments the pulse subsequence includes magnetic gradient pulses.

According to still further features in the described preferred embodiments a slice-refocusing gradient is employed during a time interval selected from the group consisting of the first half creation time interval, the second half creation time interval the multiple quantum evolution time interval, the magnetization transfer period and a time to echo.

According to still further features in the described preferred embodiments a read-refocusing gradient is employed during a time interval selected from the group consisting of the first half creation time interval, the second half creation time interval the multiple quantum evolution time interval, the magnetization transfer period and a time to echo.

According to still further features in the described preferred embodiments a phase gradient is employed during a time interval selected from the group consisting of the first half creation time interval, the second half creation time interval the multiple quantum evolution time interval, the magnetization transfer period and a time to echo.

According to still further features in the described preferred embodiments the object is a swollen elastomer.

According to still further features in the described preferred embodiments the object is a food material.

The present invention successfully addresses the shortcomings of the presently known configurations by providing a method of magnetic resonance analysis and imaging, the method enjoy new contrast in MRI, far exceeding the prior art.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

The present invention is of a method of Magnetic Resonance Imaging (MRI), which can be used for obtaining new contrast in MRI. Specifically, the present invention can be used to obtain MRI contrast of, for example, connective tissues and organs such as brain, by employing selective excitation following multiple quantum transitions.

The principles and operation of the method according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

While reducing the present invention to practice, as is demonstrated and exemplified in the Examples section that follows, a Multiple Quantum Filter (MQF) followed by exclusive excitation of $^1H$ has been shown to result in a new type of contrast that depends on the specific properties of tissue proteins. Exclusive excitation of $^1H$ spectrum of large proteins is especially useful when followed by an appropriate method, which exploit intrinsic physical and chemical processes of magnetization transfer, to obtain Magnetization Transfer Contrast (MTC).

MQF-MTC imaging provides a new contrast, which is based on the strong effect of dipolar interaction between protons within large proteins, which on a relatively short time scale (of the order of tens of microseconds), leads to an exclusive excitation of the protons in the protein, leaving a substantial portion of the protons in the water molecules at ground state. In all of the presently known MTC methods, the suppression of the water excitations is insufficient for differentiating between direct excitation of the water molecules and magnetization that was transferred from the protein to the water. According to the present invention, an exclusive excitation of protons in the protein preceding the magnetization transfer process ensures that a measurement which follows the magnetization transfer process is proportional to the number of protons in the various quantum states of the protein.

Tissues are characterized by the dependence of their MQF signal on the multiple quantum (MQ) evolution time. Using MQF-MTC imaging, higher tissue contrast is obtained between, for example, tendon, cartilage and bone. The tendons, which give weak signals compared to their surrounding in standard MRI techniques, are significantly highlighted in an appropriately created MQF-MTC image.

Any NMR method for analyzing or imaging objects is characterized by a pulse sequence, applied to the objects, so as to create excitations within the atoms making the object. In an acquisition step, following the pulse sequence, excitations signals from the objects are further analyzed by computational methods to provide a spectroscopic analysis or a visual image of the objects. A convenient way to describe the various processes occurring during a pulse sequence is by the so called irreducible spherical tensor operator basis, $T_{r,n}$. Each tensor $T_{r,n}$ is uniquely defined by its rank (the first index, herein denoted r) and its coherence (the second index herein denoted n). The irreducible spherical tensor operator basis is with a one to one correspondence to a spin operator basis $I_z$, $I+=I_x+iI_y$, and $I_-=I_x-iI_y$. For example, in the case of a single spin $I \geq 1$, $T_{1,0}$ is proportional to to the longitudinal spin operator $I_z$, and $T_{1,\pm 1}$ are proportional to the transverse spin operators $I_\pm$, respectively. A detailed derivation of the irreducible spherical tensor operator basis can be found in Bowden G J and Hutchison W D, titled "tensor operator formalism multiple-quantum NMR" J. Magn. Reson. 1984; 58:370-388, which is incorporated herein by reference.

The irreducible spherical tensor operator basis facilitates understanding of the processes occurring in objects placed in a region where strong magnetic fields are present. For example, the coherence n of a tensor can be altered by a radiofrequency pulse within the limits of $-r \leq n \leq r$. In addition, relaxation or modulation by, e.g., dipolar interaction or J-coupling leads to an evolution (increment or decrement) of the rank r at fixed value of coherence n.

Thus, according to a preferred embodiment of the present invention there is provided a method of magnetic resonance analysis of at least one type of molecules present in a solvent. The method is executed by implementing the following method steps, using, for example, a conventional magnetic resonance spectrometer, wherein in a first step, a first radiofrequency pulse sequence selected so as to initially select a coherence of an order n is applied to the at least one type of molecules in the solvent, wherein n is zero, a positive or a negative integer other than ±1, and thereafter to select an exclusive excitation of the at least one type of molecules in the solvent. The at least one type of molecules may be, for example, at least one macromolecule, such a protein, and the solvent may be either a polar or an apolar solvent.

The index n defines a quantum level, thus, n=2 corresponds to a double-quantum coherence, n=3 corresponds to a triple-quantum coherence, etc. The efficiency of formation of the multi-quantum coherence (i.e. n>2), relates to the magnitude of the dipolar interaction between the protons. Within the at least one type of molecules, the protons move slowly, and hence the dipolar interaction effect is strong. On the other hand, within the solvent, the protons are in a state of fast relative motion and the dipolar interaction effect is much weaker. Hence, on a shorter time scale, the multiple quantum creation periods, τ, and the multiple quantum evolution periods, $t_{MQ}$, the protons in the at least one type of molecules are excited while a substantially large portion of the protons in the solvent are not excited via the same coherence pathway. Thus for very short magnetization transfer periods, $t_{LM}$, water molecules that may exchange protons with the protein are not observed.

According to a preferred embodiment of the present invention, the coherence n can be selected by either phase cycling or by gradient selection.

The first radiofrequency pulse sequence may be any sequence designed for achieving an exclusive excitation.

Figure 1:
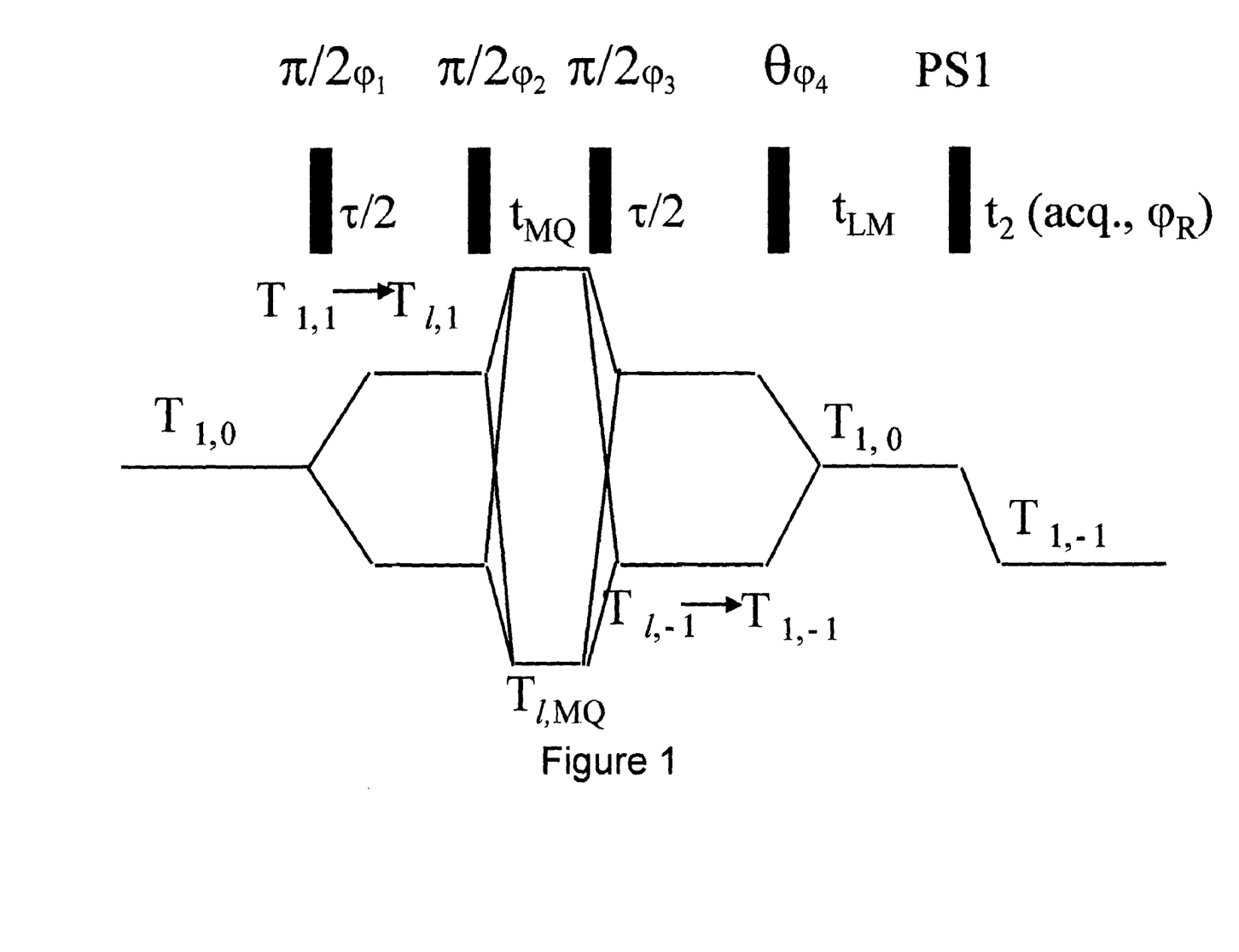
FIG. 1 is a radiofrequency pulse sequence used in the method according to the present invention.

Referring now to the drawings, FIG. 1 illustrates a radiofrequency pulse sequence used in the method according to the present invention. The radiofrequency pulse sequence is preferably of four phases denoted in FIG. 1 as ($\phi_1$, $\phi_2$, $\phi_3$ and $\phi_4$. According to a preferred embodiment of the present invention, the first three ($\phi_1$, $\phi_2$ and $\phi_3$) are used as the first radiofrequency pulse sequence. Hence, the first radiofrequency pulse sequence includes a first 90° radiofrequency pulse, a first half creation time interval τ/2, a second 90° radiofrequency pulse, a multiple quantum evolution time interval $t_{MQ}$, a third 90° radiofrequency pulse and a second half creation time interval τ/2.

A skilled artisan will appreciate, that at the end of the first step of the presently preferred embodiment of the invention, an exclusive excitation of protons in the protein is selected so as to exploit the process of magnetization transfer in a manner described hereinafter.

Hence, a second step of the method includes measuring at least one magnetic resonance parameter of the solvent, which, in a third step is used for calculating at least one magnetic resonance parameter of the at least one type of molecule. The measurement may be done in any suitable way, so as to ensure a substantial correspondence between the magnetic resonance parameter of the solvent and the magnetic resonance parameter of the at least one type of molecules to be calculated in the third step. The measured magnetic resonance parameter of the solvent is preferably a transverse magnetization, with respect to a direction of the NMR primary magnetic field. The calculated magnetic resonance parameter of the at least one type of molecules is preferably a longitudinal magnetization.

Hence, according a preferred embodiment of the present invention, the step of measurement comprises, applying a second radiofrequency pulse sequence, and acquiring a radiofrequency signal resulting from the solvent.

The second radiofrequency pulse sequence is selected so as to restore a zero-order coherence and a first order rank to the at least one molecule, and to achieve transfer of the zero-order coherence and a first order rank to the solvent, by intrinsic physical and chemical processes. An irreducible spherical tensor of rank 1 and coherence 0 ($T_{1,0}$) corresponds to the projection of the nuclear spin expectation value onto the longitudinal direction, hence the purpose of the second radiofrequency pulse sequence is to rotate the magnetization of the at least one type of molecules from the transverse plane to a longitudinal direction.

Typically, a 90° pulse is known to flip the magnetization in such manner. However, a 90° pulse enforces a magnetization flip to all the non-zero spin nuclei, without distinction between various components such as solvent components and non-solvent components. It should be appreciated that the advantage of the present invention is in the elimination of the contribution of the solvent to the signal that may be observed at the end of the first radiofrequency pulse sequence. By the time the second radiofrequency pulse sequence starts, the solvent is in a state of zero transverse magnetization, hence the at least one type of molecules is exclusively flipped to the transverse plane.

Referring now again to FIG. 1, the fourth pulse with phase $\phi_4$ restores the irreducible spherical tensor $T_{1,0}$. The duration $\theta$ of the fourth pulse with phase $\phi_4$ is selected so as to optimize the analysis performed in the acquisition step. A presently preferred value for $\theta$ is 90°.

Once the longitudinal magnetization of the at least one type of molecules is restored, a process of magnetization transfer from the at least one type of molecules to the solvent initiates. The duration of the process is set to be a magnetization transfer period denoted $t_{LM}$ (FIG. 1). At any time within $t_{LM}$, the longitudinal magnetization value of the at least one type of molecules is proportional to that of the solvent. In accordance with the presently preferred embodiment of the invention, by measuring the solvent magnetization, a unique value of the desired magnetization of the at least one type of molecules can be calculated.

In the currently available conventional magnetic resonance spectrometers, the signal-to-noise ratio that may be obtained by direct measurement of longitudinal magnetization is extremely small. In the presently preferred embodiment of the invention, in order to receive an optimized signal from the solvent, a radiofrequency pulse subsequence (PS1 in FIG. 1) is further applied, so as to select a coherence of −1, which corresponds to a magnetization substantially engaging the transverse plane.

PS1 can be any subsequence known in the art, depending on the desired implementation of the present invention. For spectroscopic studies, PS1 can be a hard pulse or any pulse sequence suitable for localized spectroscopy, such as ISIS [Paul T. Callaghan, Principles of Nuclear Magnetic Resonance Microscopy, Clarendon Press-Oxford 1993, p. 287]. Alternatively, PS1 can be a slice selective pulse sequence, or other imaging sequence, such as but not limited to the GEFI sequence. [Paul T. Callaghan, Principles of Nuclear Magnetic Resonance Microscopy, Clarendon Press-Oxford 1993, p. 134].

The principles of the present invention may also be used to improve contrasts in slice images of tissues, such as a connective tissue.

Thus, according to a preferred embodiment of the present invention there is provided a method of magnetic resonance imaging of an object having solvent components and non-solvent components. A first step, according to the presently preferred embodiment of the invention is to apply a first radiofrequency pulse sequence. The purpose of the first radiofrequency pulse sequence is to achieve an exclusive excitation of the non-solvent components by selecting a coherence of an order $n \neq \pm 1$ to the solvent components and the on-solvent components.

In a second step, at least one magnetic resonance parameter of the solvent components is measured, and in a third step the magnetic resonance parameter(s) of the solvent components are used thereafter for calculating at least one magnetic resonance parameter of the non-solvent components, so as to construct a magnetic resonance image of the object.

While implementing the present invention, a slice refocusing gradient, a read gradient or a phase gradient may be employed during the creation time interval, the multiple quantum evolution time or the time to echo.

Figure 2:
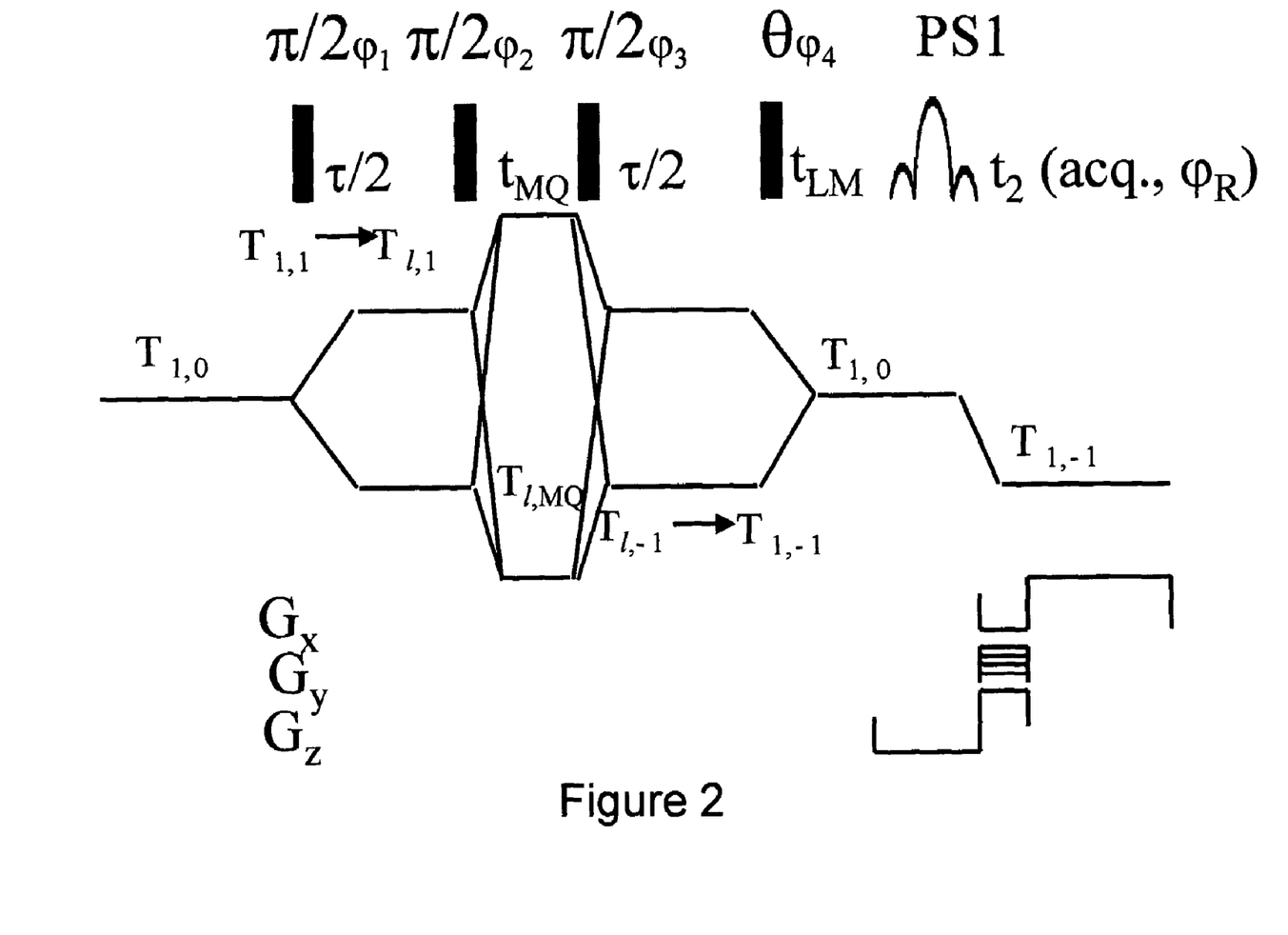
FIG. 2 is a radiofrequency pulse sequence further comprising a longitudinal gradient, and two transverse gradients used in the method according to the present invention.

Reference is now made to FIG. 2, which illustrates a pulse sequence according to a presently preferred embodiment of the invention. The first four pulses are the same as shown in FIG. 1, whereas the PS1 radiofrequency pulse is accompanied by a longitudinal gradient $G_z$. PS1 and $G_z$ serve to obtain slice selection. In addition, two gradients $G_x$ and $G_y$ are applied as read and phase gradients.

It will be appreciated that the nature of the object studied by the method of the present invention is of less importance, provided that the object includes the atomic nucleus of choice. As stated, suitable atomic nuclei are non-zero spin nuclei, which include, for example, $^1H$, $^2H$ and $^{23}Na$. For example, the method of the present invention may be useful for studying and imaging of different food or industrial materials, e.g. swollen elastomers.

In particular, the method of the present invention has been specifically calibrated so as to yield slice images of tissues, such as a connective tissue. The scope of the present invention is not limited to providing slice images of connective tissues, as any tissue of sufficient order and for that matter any other object may be analyzed using the method of the present invention. An analyzed tissue according to the present invention can, for example, be a tendon, a portion of a skin, a bone, a muscle, a cartilage, a blood vessel, a ligament, an organ (e.g., a brain, a heart, a kidney, a gland, a testicle, an ovary, an eye, a liver, a pancreas or a spleen) or a portion thereof, a nerve or a lymph node.

One advantage of the present invention is the enhanced flexibility whereby a high-level analysis as well as high quality contrasts, can be achieved by varying several controlling parameters. For example, variation of the multiple quantum evolution time controls the contrast between different kinds of proteins having different relaxation times. Hence, the multiple quantum evolution time is selected so as to maximize the radiofrequency signal of the selected nucleus, or to obtain a desired contrast within the imaged object.

In addition, the rate of spin diffusion within the non-solvent components depends both on the magnetization transfer period $t_{LM}$ and on the creation time interval $\tau$. The magnetization transfer period and the creation time interval are selected so as to control the rate of spin diffusion within the non-solvent components. Specifically, selecting short $t_{LM}$ and short $\tau$, reduce the effect of spin diffusion on the observed spectrum. In addition, the magnetization transfer period is selected so as to optimize a rate of magnetization transfer from the non-solvent components to the solvent components. This optimization is typically achieved by selecting the magnetization transfer period in the range of 1-100 ms. Alternatively, the magnetization transfer period may be selected above 100 ms, so as to optimize the spin-lattice relaxation time of the solvent components which are close to the non-solvent components.

Furthermore, a time to echo, as is controlled by the magnetic gradient pulses, is selected, so as to maximize the radiofrequency signal derived from the selected nucleus, or to obtain a desired contrast within the imaged object.

In addition, applying a crusher pulse prior to applying the radiofrequency pulse sequence is preferably applied so as to permit shortening of the repetition time without increasing the single quantum leakage. The crusher pulse can be a magnetic gradient pulse, a radiofrequency pulse and a combination thereof. According to a presently preferred embodiment, the crusher pulse includes a first 90° radiofrequency pulse, followed by a gradient pulse, itself followed by a second 90° radiofrequency pulse.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion.

Example 1

Magnetization Transfer from Protein to Water

Figure 3:
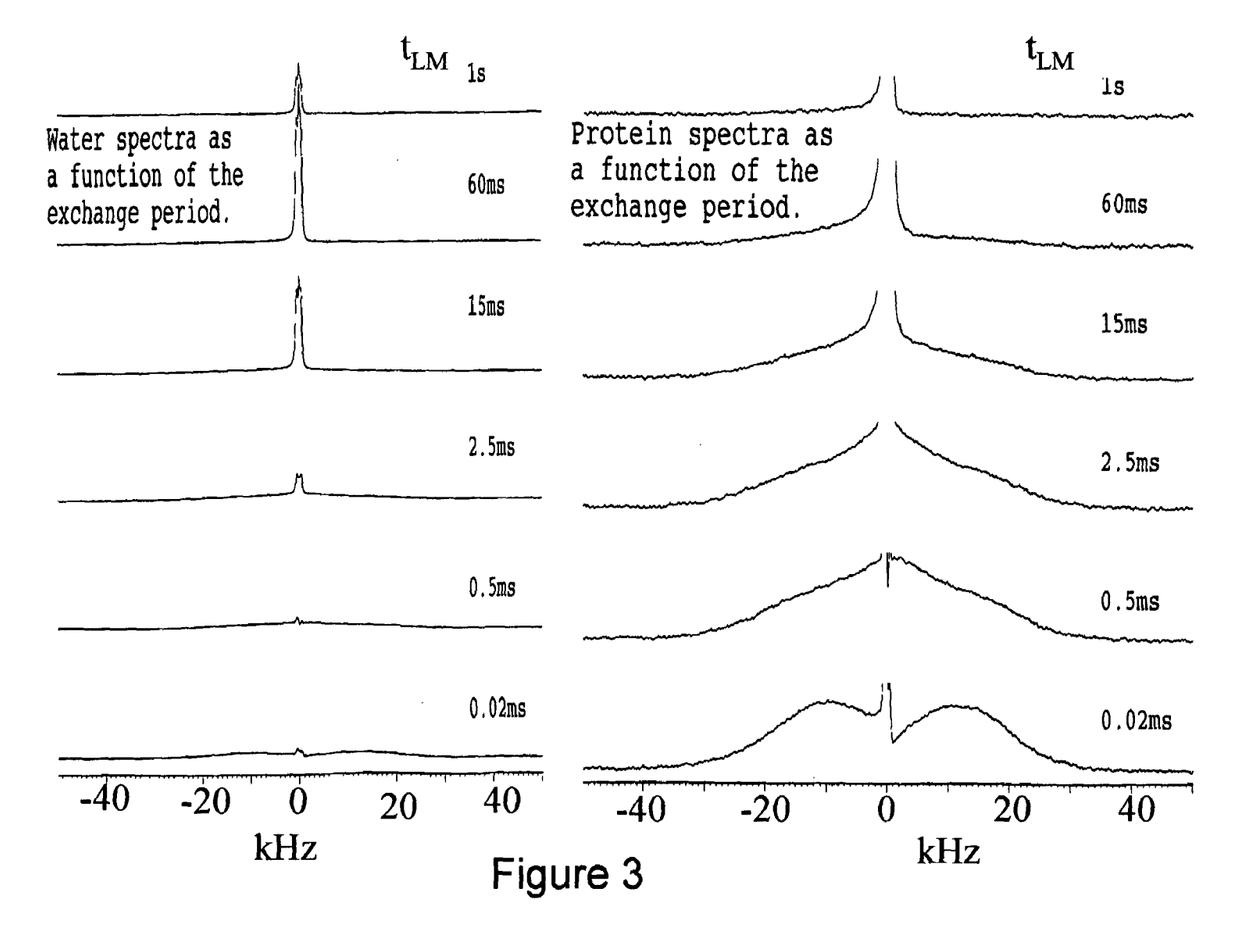
FIG. 3 is spectra of the water and protein signals as a function of the magnetization transfer period according to the present invention.
Figure 4:
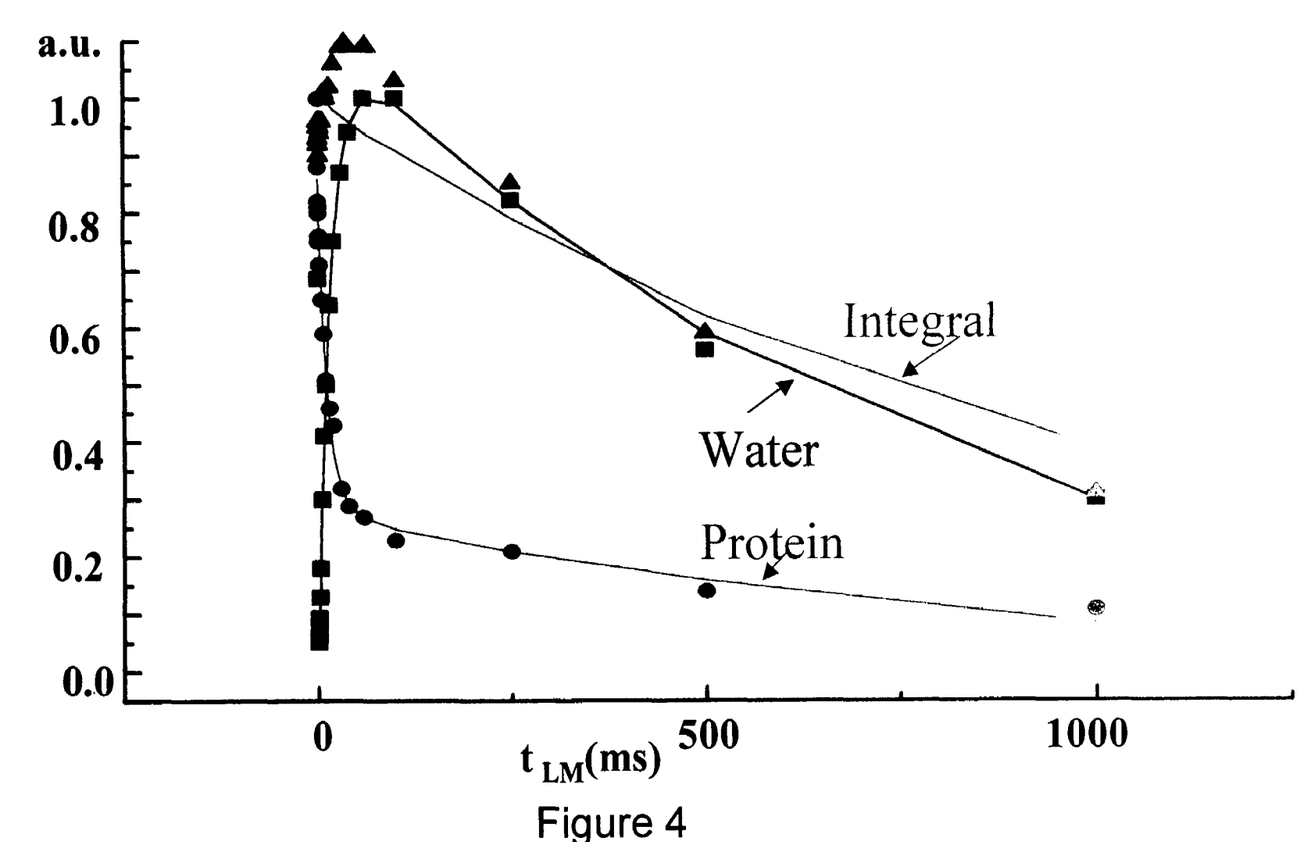
FIG. 4 is a graph of the integrals of water and protein spectra as a function of the magnetization transfer period according to the present invention.

The spectra of the water and protein signals as a function of the magnetization transfer period $t_{LM}$, according to the present invention, are shown in FIG. 3. The simultaneous rise of the water signal and the decline of the broad protein signal represent the process of magnetization transfer from the protein to the water, within a short period of the order of tens of milliseconds. The effect is further exemplified in FIG. 4 illustrating graphically the dependence of the integrals of the water and protein spectra on the magnetization transfer period $t_{LM}$.

Following the fast magnetization transfer process, both the water and the residual protein signals decay with a rate constant, which is a weighted average of the longitudinal relaxation rates of the water and the protein protons.

Example 2

Imaging of an Achilles Tendon and an Articular Cartilage

For illustrating the contrast obtained by the DQF-MTC imaging method a sample consisted of two types of tissues, bovine Achilles tendon and articular cartilage attached to one another.

Figure 5:
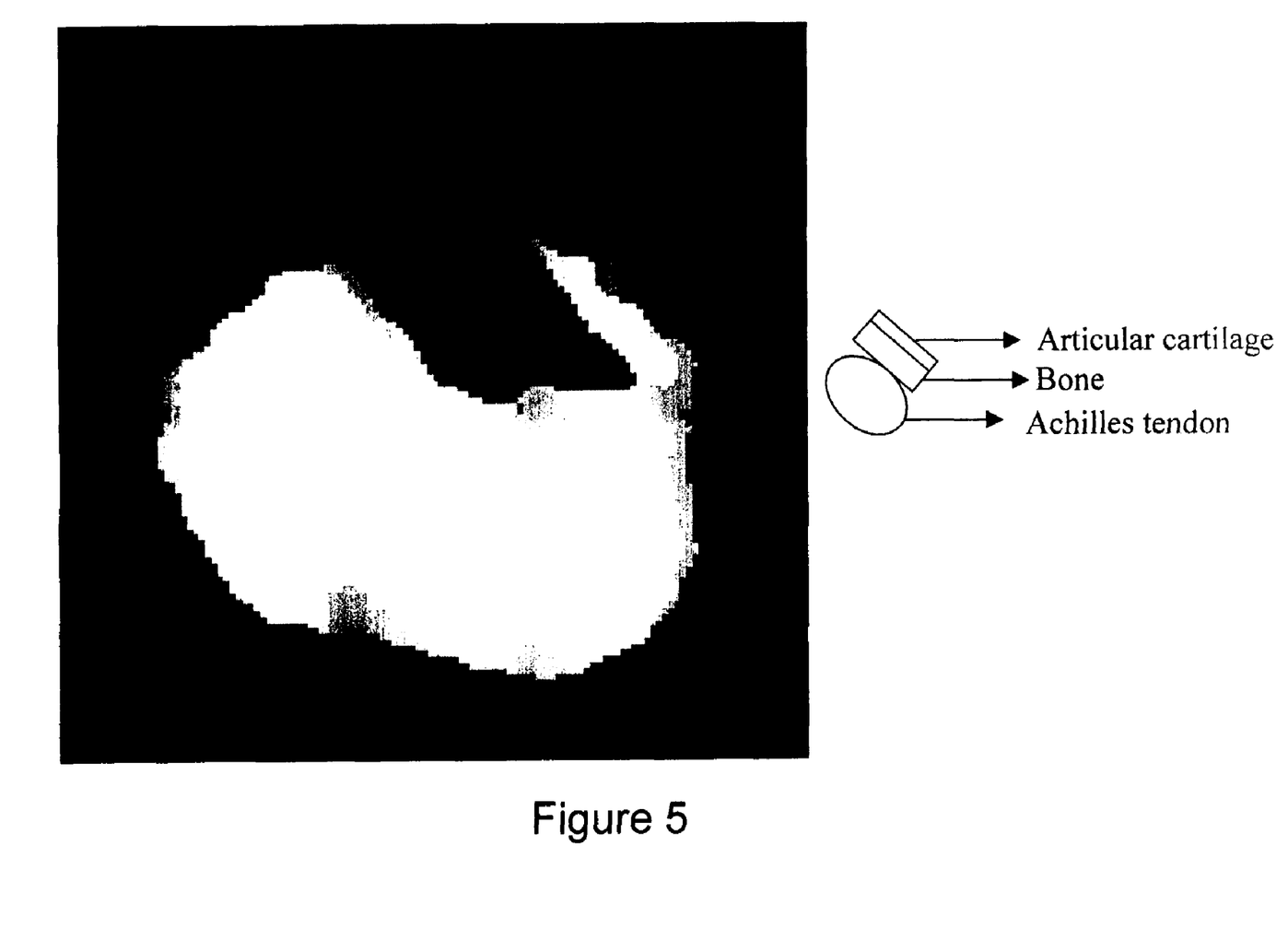
FIG. 5 is an image obtained using the method of the present invention, of a sample consisting of an Achilles tendon and an articular cartilage attached to a bone.

Imaging was conducted on a 360 MHz Bruker WB spectrometer, using the DQF-MTC MRI pulse sequence shown in FIG. 2 with τ and $t_{LM}$ set as 7 µs and 5 µs respectively. The obtained image is shown in FIG. 5. The signals originating from the tendon, which gives in standard MRI a weaker signals than those of the cartilage, become comparable with the latter when imaged in accordance to the teachings of the the present invention.

Example 3

Imaging of Mouse Brain

For illustrating the contrast obtained by the DQF-MTC imaging method a sample tube containing an excised mouse brain was prepared.

Imaging was conducted on a 360 MHz Brukers Avance spectrometer, using the DQF-MTC MRI pulse sequence shown in FIG. 2.

Figure 6A:
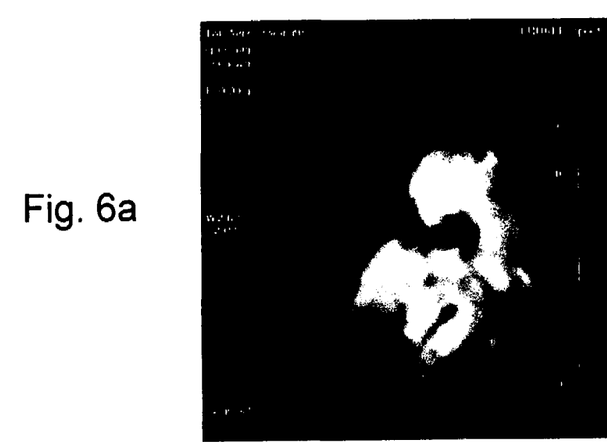
FIG. 6a is an image of a transverse cross section of a mouse brain, obtained using a single quantum gradient echo imaging method.
Figure 6B:
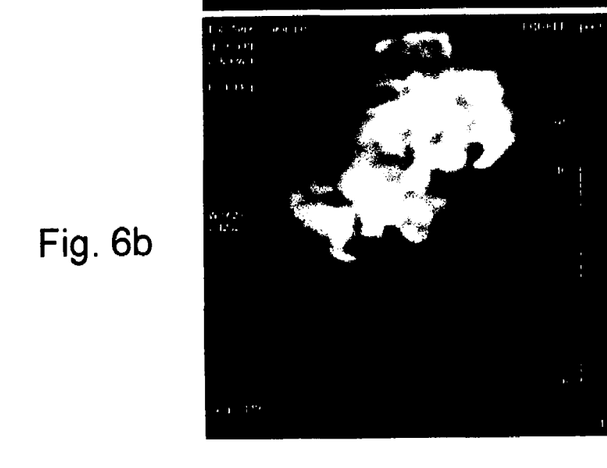
FIG. 6b is a an image of sagital cross section of a mouse brain, obtained using a single quantum gradient echo imaging method.
Figure 6C:
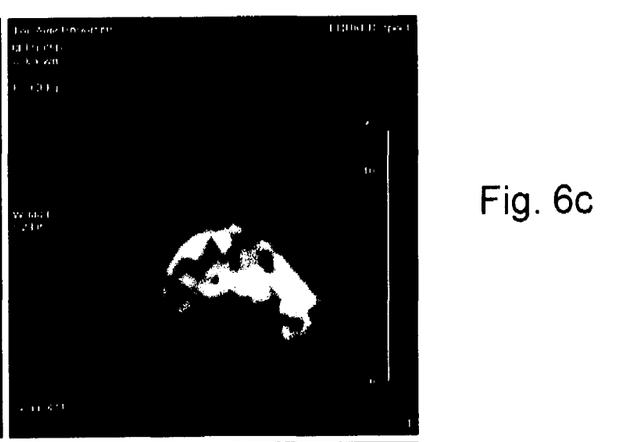
FIG. 6c is an image of a transverse cross section of a mouse brain, obtained using the method of the present invention.
Figure 6D:
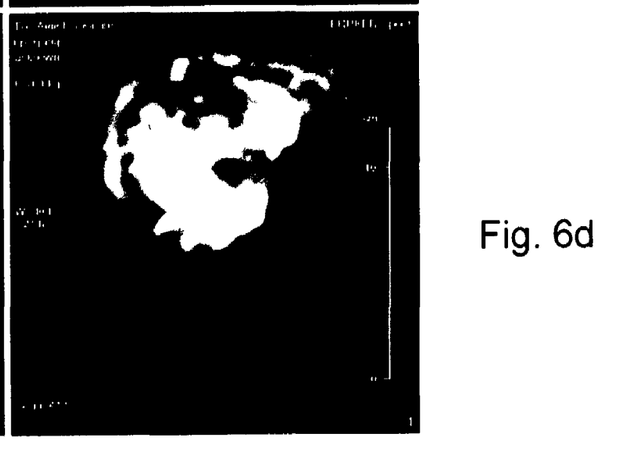
FIG. 6d is an image of sagital cross section of a mouse brain, obtained using the method of the present invention.

FIGS. 6a-d shows the imaging of a mouse brain using two different techniques. FIGS. 6a and 6b are respectively images of a transverse cross section and sagital cross section of a mouse brain, obtained by single quantum gradient echo imaging method. The obtained images provide very little information as the contrast there between the various parts of the brian is low. FIGS. 6c and 6d are the same images obtained using the DQF-MTC MRI method. Contrasts between various areas of the sample are clearly observed.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method of magnetic resonance analysis of at least one type of macromolecules present in a solvent, the method comprising:
   (a) applying a first radiofrequency pulse sequence selected so as to initially select a coherence of an order n for the at least one type of macromolecules in the solvent, wherein n is zero, a positive or a negative integer other than ±1, and thereafter to select an exclusive excitation of the at least one type of macromolecules in the solvent;
   (b) applying a second radiofrequency pulse sequence which comprises a radiofrequency-free magnetization transfer period so as to generate conditions for maintaining said exclusive excitation of the at least one type of molecules over said magnetization transfer period, said magnetization transfer period being sufficient to allow magnetization transfer from the at least one type of macromolecules to the solvent;
   (c) measuring at least one magnetic resonance parameter of the solvent; and
   (d) using said at least one magnetic resonance parameter of the solvent for calculating at least one magnetic resonance parameter of the at least one molecule.

2. The method of claim 1, wherein the at least one type of macromolecules present in the solvent is selected from the group consisting of molecule dissolved in the solvent, a molecule dispersed in the solvent and a molecule emulsed in the solvent.

3. The method of claim 1, wherein said macromolecule is selected from the group consisting of a protein, a glycoprotein, a proteolipid, a lipid, a carbohydrate, a nucleic acid and a complex of macromolecules which comprises at least two components selected from the group consisting of a protein, a glycoprotein, a proteolipid, a lipid, a carbohydrate, a nucleic acid.

4. The method of claim 1, wherein the solvent is a polar solvent.

5. The method of claim 1, wherein the solvent is an apolar solvent.

6. The method of claim 1, wherein the solvent is water.

7. The method of claim 1, wherein the solvent comprises a buffering agent.

8. The method of claim 1, wherein the at least one type of macromolecules and the solvent each characterized by an NMR spectrum characterized by a plurality of NMR spectral lines, said NMR spectral lines characterizing the at least one type of macromolecules are wider than said NMR spectral lines characterizing the solvent.

9. The method of claim 1, wherein said at least one magnetic resonance parameter of the solvent comprises a transverse magnetization of the solvent, with respect to a direction of a primary magnetic field.

10. The method of claim 9, wherein said at least one magnetic resonance parameter of the at least one type of macromolecules comprises a longitudinal magnetization of the at least one molecule, with respect to a direction of said primary magnetic field.

11. The method of claim 1, wherein said coherence is selected from the group consisting of double quantum filter (DQF), where n is selected from the group consisting of +2 and −2 and triple quantum filter (TQF), where n is selected from the group consisting of +3 and −3.

12. The method of claim 1, wherein said coherence is selected by phase cycling or gradient selection.

13. The method of claim 1, wherein said first radiofrequency pulse sequence is selected so as to enable analysis of an atomic nucleus selected from the group consisting of $^1$H, $^2$H and $^{23}$Na.

14. The method of claim 13, wherein said first radiofrequency pulse sequence is selected so as to optimize analysis of said atomic nucleus.

15. The method of claim 1, wherein said first radiofrequency pulse sequence comprises a first 90° radiofrequency pulse, a first half creation time interval, a second 90° radiofrequency pulse, a multiple quantum evolution time interval, a third 90° radiofrequency pulse and a second half creation time interval.

16. The method of claim 15, wherein a slice-refocusing gradient is employed during a time interval selected from the group consisting of said first half creation time interval, said second half creation time interval said multiple quantum evolution time interval and a time to echo.

17. The method of claim 15, wherein a read gradient is employed during a time interval selected from the group consisting of said first half creation time interval, said second half creation time interval said multiple quantum evolution time interval and a time to echo.

18. The method of claim 15, wherein a phase gradient is employed during a time interval selected from the group consisting of said first half creation time interval, said second half creation time interval said multiple quantum evolution time interval and a time to echo.

19. The method of claim 1, wherein said multiple quantum evolution time interval is a double quantum evolution time interval.

20. The method of claim 1, wherein said multiple quantum evolution time interval is a triple quantum evolution time interval.

21. The method of claim 1, further comprising applying a crusher pulse prior to step (a).

22. The method of claim 21, wherein said crusher pulse is selected from the group consisting of a magnetic gradient pulse, a radiofrequency pulse and a combination thereof.

23. The method of claim 21, wherein said crusher pulse comprises a first 90° radiofrequency pulse, followed by a gradient pulse.

24. The method of claim 1, wherein said second radiofrequency pulse sequence selected so as to:
restore a zero-order coherence and a first order rank to the at least one molecule, thereby to maintain said exclusive excitation of the at least one type of molecules over said magnetization transfer period;
achieve said magnetization transfer by intrinsic physical and chemical processes; and
provide at least one detectable component of said magnetic resonance parameter of the solvent; and
said step (b) comprises acquiring a radiofrequency signal resulting from the solvent.

25. The method of claim 24, wherein said first radiofrequency pulse sequence comprises a first 90° radiofrequency pulse, a first half creation time interval, a second 90° radiofrequency pulse, a multiple quantum evolution time interval, a third 90° radiofrequency pulse and a second half creation time interval.

26. The method of claim 25, wherein said first half creation time and said second half creation time are selected so as to maximize said radiofrequency signal.

27. The method of claim 25, wherein said first half creation time and said second half creation time are selected so as to create images that are weighted by the size of the dipolar interaction in within the at least one molecule.

28. The method of claim 24, wherein said second radiofrequency pulse sequence comprises a forth radiofrequency pulse, said magnetization transfer period, and a radiofrequency pulse subsequence.

29. The method of claim 28, wherein said magnetization transfer period is selected so as to create images that are weighted by a rate of spin diffusion within the at least one molecule.

30. The method of claim 28, wherein said magnetization transfer period is selected so as to create images that are weighted by a rate of magnetization transfer from the at least one type of macromolecules to the solvent.

31. The method of claim 28, wherein said magnetization transfer period is selected so as to create images that are weighted by the at least one spin-lattice relaxation time of the solvent.

32. The method of claim 28, wherein said forth radiofrequency pulse is a forth 90° radiofrequency pulse.

33. The method of claim 28, wherein said pulse subsequence comprises a hard radiofrequency pulse.

34. The method of claim 28, wherein said pulse subsequence comprises a localized spectroscopy pulse subsequence.

35. The method of claim 28, wherein a slice-refocusing gradient is employed during a time interval selected from the group consisting of said first half creation time interval, said second half creation time interval said multiple quantum evolution time interval, said magnetization transfer period and a time to echo.

36. The method of claim 28, wherein a read gradient is employed during a time interval selected from the group consisting of said first half creation time interval, said second half creation time interval said multiple quantum evolution time interval, said magnetization transfer period and a time to echo.

37. The method of claim 28, wherein a phase gradient is employed during a time interval selected from the group consisting of said first half creation time interval, said second half creation time interval said multiple quantum evolution time interval, said magnetization transfer period and a time to echo.

38. A method of magnetic resonance imaging of an object having solvent components and non-solvent components which include macromolecules, the method comprising:
(a) applying a first radiofrequency pulse sequence selected so as to initially select a coherence of an order n for the solvent components and the non-solvent components, wherein n is zero, a positive or a negative integer other than ±1 and thereafter to select an exclusive excitation of the non-solvent components; and (b) applying a second radiofrequency pulse sequence which comprises a radiofrequency-free magnetization transfer period so as to generate conditions for maintaining said exclusive excitation of the non-solvent components over said magnetization transfer period, said magnetization transfer period being sufficient to allow magnetization transfer from the non-solvent components to the solvent components;

(c) measuring at least one magnetic resonance parameter of the solvent components; and (d) using said at least one magnetic resonance parameter of the solvent components for calculating at least one magnetic resonance parameter of the non-solvent components so as to construct a magnetic resonance image of the object.

39. The method of claim 38, wherein the object is a tissue.

40. The method of claim 39, wherein said tissue is a connective tissue.

41. The method of claim 40, wherein said tissue is selected from the group consisting of a tendon, a portion of a skin, a bone, a muscle, a cartilage, a blood vessel, a ligament, an organ or a portion thereof, a nerve and a lymph node.

42. The method of claim 41, wherein said organ is selected from the group consisting of a brain, a heart, a kidney, a gland, a testicle, an ovary, an eye, a liver, a pancreas and a spleen.

43. The method of claim 38, wherein said macromolecule is selected from the group consisting of a protein, a glycoprotein, a proteolipid, a lipid, a carbohydrate, a nucleic acid and a complex of macromolecules which comprises at least two components selected from the group consisting of a protein, a glycoprotein, a proteolipid, a lipid, a carbohydrate, a nucleic acid.

44. The method of claim 38, wherein the solvent components are polar solvent components.

45. The method of claim 38, wherein the solvent components are apolar solvent components.

46. The method of claim 38, wherein the solvent components are water components.

47. The method of claim 38, wherein the solvent components include buffering agents.

48. The method of claim 38, wherein the non-solvent components and the solvent components each characterized by an NMR spectrum characterized by a plurality of NMR spectral lines, said NMR spectral lines characterizing the non-solvent components are wider than said NMR spectral lines characterizing the solvent components.

49. The method of claim 38, wherein said at least one magnetic resonance parameter of the solvent components comprises a transverse magnetization of the solvent components, with respect to a direction of a primary magnetic field.

50. The method of claim 49, wherein said at least one magnetic resonance parameter of the non-solvent components comprises a longitudinal magnetization of the non-solvent components, with respect to a direction of said primary magnetic field.

51. The method of claim 38, wherein said coherence is selected from the group consisting of double quantum filter (DQF), where n is selected from the group consisting of +2 and −2 and triple quantum filter (TQF), where n is selected from the group consisting of +3 and −3.

52. The method of claim 38, wherein said coherence is selected by phase cycling or gradient selection.

53. The method of claim 38, wherein said first radiofrequency pulse sequence is selected so as to enable imaging of an atomic nucleus selected from the group consisting of $^1H$, $^2H$ and $^{23}Na$.

54. The method of claim 53, wherein said first radiofrequency pulse sequence is selected so as to create images that are weighted by the imaging of said atomic nucleus.

55. The method of claim 38, wherein said first radiofrequency pulse sequence comprises a first 90° radiofrequency pulse, a first half creation time interval, a second 90° radiofrequency pulse, a multiple quantum evolution time interval, a third 90° radiofrequency pulse and a second half creation time interval.

56. The method of claim 55, wherein a slice-refocusing gradient is employed during a time interval selected from the group consisting of said first half creation time interval, said second half creation time interval said multiple quantum evolution time interval and a time to echo.

57. The method of claim 55, wherein a read gradient is employed during a time interval selected from the group consisting of said first half creation time interval, said second half creation time interval said multiple quantum evolution time interval and a time to echo.

58. The method of claim 55, wherein a phase gradient is employed during a time interval selected from the group consisting of said first half creation time interval, said second half creation time interval said multiple quantum evolution time interval and a time to echo.

59. The method of claim 38, wherein said multiple quantum evolution time interval is a double quantum evolution time interval.

60. The method of claim 38, wherein said multiple quantum evolution time interval is a triple quantum evolution time interval.

61. The method of claim 38, wherein said multiple quantum evolution time interval is selected so as to optimize a resolution between the non-solvent components which are characterized by different multiple quantum relaxation times.

62. The method of claim 38, further comprising applying a crusher pulse prior to step (a).

63. The method of claim 62, wherein said crusher pulse is selected from the group consisting of a magnetic gradient pulse, a radiofrequency pulse and a combination thereof.

64. The method of claim 62, wherein said crusher pulse comprises a first 90° radiofrequency pulse, followed by a gradient pulse.

65. The method of claim 38, wherein said second radiofrequency pulse sequence is selected so as to:

restore a zero-order coherence and a first order rank to the non-solvent components, thereby to maintain said exclusive excitation of the non-solvent components over said magnetization transfer period; and achieve said magnetization transfer by intrinsic physical and chemical processes; and select a slice of the object to be imaged and create an image; and said step (b) comprises acquiringe a radiofrequency signal resulting from the solvent components.

66. The method of claim 65, wherein said first radiofrequency pulse sequence comprises a first 90° radiofrequency pulse, a first half creation time interval, a second 90° radiofrequency pulse, a multiple quantum evolution time interval, a third 90° radiofrequency pulse and a second half creation time interval.

67. The method of claim 66, wherein said first half creation time and said second half creation time are selected so as to maximize said radiofrequency signal or to obtain a desired contrast.

68. The method of claim 66, wherein said first half creation time and said second half creation time are selected so as to create images that are weighted by the size of the dipolar interaction in within the non-solvent components.

69. The method of claim 65, wherein said second radiofrequency pulse sequence comprises a forth radiofrequency pulse, said magnetization transfer period, and a pulse subsequence that creates Free Induction Decay (FID) for spectroscopic and imaging purposes.

70. The method of claim 69, wherein said magnetization transfer period is selected so as to create images that are weighted by the size of the dipolar interaction in the non-solvent components.

71. The method of claim 69, wherein said magnetization transfer period is selected so as to create images that are weighted by a rate of magnetization transfer from the non-solvent components to the solvent components.

72. The method of claim 69, wherein said magnetization transfer period is selected so as to create images that are weighted by at least one spin-lattice relaxation time of the solvent components.

73. The method of claim 69, wherein said forth radiofrequency pulse is a forth 90° radiofrequency pulse.

74. The method of claim 69, wherein said pulse subsequence comprises a hard radiofrequency pulse.

75. The method of claim 69, wherein said pulse subsequence comprises a localized spectroscopy pulse subsequence.

76. The method of claim 69, wherein said pulse subsequence comprises magnetic gradient pulses.

77. The method of claim 69, wherein a slice-refocusing gradient is employed during a time interval selected from the group consisting of said first half creation time interval, said second half creation time interval said multiple quantum evolution time interval, said magnetization transfer period and a time to echo.

78. The method of claim 69, wherein a read-refocusing gradient is employed during a time interval selected from the group consisting of said first half creation time interval, said second half creation time interval said multiple quantum evolution time interval, said magnetization transfer period and a time to echo.

79. The method of claim 69, wherein a phase gradient is employed during a time interval selected from the group consisting of said first half creation time interval, said second half creation time interval said multiple quantum evolution time interval, said magnetization transfer period and a time to echo.

80. The method of claim 69, wherein the object is a swollen elastomer.

81. The method of claim 69, wherein the object is a food material.

* * * * *